(12) United States Patent
Ohkubo et al.

(10) Patent No.: US 6,611,300 B1
(45) Date of Patent: *Aug. 26, 2003

(54) SEMICONDUCTOR ELEMENT AND LIQUID CRYSTAL DISPLAY DEVICE USING THE SAME

(75) Inventors: Tatsuya Ohkubo, Hitachinaka (JP); Genshiro Kawachi, Hitachi (JP); Yoshiro Mikami, Hitachi (JP); Kazuhito Masuda, Hitachi (JP); Hiroshi Kageyama, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 192 days.

This patent is subject to a terminal disclaimer.

(21) Appl. No.: 09/694,486

(22) Filed: Oct. 24, 2000

Related U.S. Application Data (63) Continuation of application No. 09/074,314, filed on May 8, 1998, now Pat. No. 6,166,786.

(30) Foreign Application Priority Data

May 8, 1997 (JP) .............................................. 9-118171

(51) Int. Cl.⁷ ........................... G02F 1/136; H01L 29/04
(52) U.S. Cl. ............................................. 349/43; 257/59
(58) Field of Search ................................ 257/403, 376, 257/487, 490, 495, 409, 328, 334, 61, 69, 336, 34, 408, 900; 349/43, 47

(56) References Cited

U.S. PATENT DOCUMENTS

| | | | |
|---|---|---|---|
| 4,809,056 A | 2/1989 | Shirato et al. | |
| 5,089,870 A | 2/1992 | Haond | |
| H1435 H | 5/1995 | Cherne et al. | |
| 5,712,501 A | 1/1998 | Davies et al. | |
| 5,812,231 A | 9/1998 | Koici et al. | |
| 5,898,204 A | 4/1999 | Watanabe | |
| 5,920,093 A | 7/1999 | Huang et al. | |
| 6,166,786 A | * 12/2000 | Ohkubo et al. | ................ 439/43 |

* cited by examiner

*Primary Examiner*—Kenneth Parker
(74) *Attorney, Agent, or Firm*—Antonelli, Terry, Stout & Kraus, LLP (57) ABSTRACT

To prevent an n-channel thin-film transistor from being deteriorated by hot holes generated in a gate-negative pulse mode. A thin polysilicon film 10 is provided with a p-type semiconductor region 13 in contact with a channel region 14. The p-type semiconductor region 13 is electrically connected to nowhere except the channel region 14. Holes induced on the surface due to a gate-negative pulse are further supplied from the p-type semiconductor region 13. An electric field established by the gate-negative pulse is relaxed by the holes, fewer hot holes are injected into the gate oxide film, and the TFT characteristics are less deteriorated.

7 Claims, 10 Drawing Sheets

TFT OF THE PRESENT INVENTION

SEMICONDUCTOR ELEMENT AND LIQUID CRYSTAL DISPLAY DEVICE USING THE SAME

CROSS-REFERENCE TO RELATED APPLICATION

This application is a continuation of application Ser. No. 09/074,314 filed on May 8, 1998 now U.S. Pat. No. 6,166,786, the entire disclosure of which is hereby incorporated by reference.

BACKGROUND OF THE INVENTION

The present invention relates to a liquid crystal display device of an active matrix type for displaying image data and character data received from OA equipment or the like, and to the structure of an n-channel thin-film transistor used for this device.

A thin-film transistor (hereinafter abbreviated as TFT) has heretofore been used for driving liquid crystals for each pixel in a panel of a liquid crystal display device of the direct-viewing type. A simple switching element suffices for the performance of the TFT and, hence, amorphous silicon has been used to form the semiconductor thin film. On the other hand, a liquid crystal display device of the projection type requires a high degree of brightness, and the TFT must be realized in a small size to increase the transmission factor. However, it was not allowed to decrease the size of the TFT formed by amorphous silicon, since its current driving ability was so small. Therefore, so-called high-temperature polysilicon has been developed, featuring an increased current driving ability by using quartz glass as a substrate and by polycrystallizing amorphous silicon at a temperature as high as 900° C. or higher.

However, quartz glass is very expensive and drives up the cost of production. Therefore, so-called low-temperature polysilicon has been developed by using an inexpensive glass substrate and polycrystallizing amorphous silicon by irradiation with a laser beam.

In recent years, strikingly improved performance has been exhibited by the TFT formed by using low-temperature polysilicon. Under such circumstances, there is a tendency to utilize the TFT not only as a switching element for driving the pixels of a panel in a liquid crystal display device, but also for the peripheral drive circuits in the liquid crystal display device. Moreover, a liquid crystal display device, such as a system-in-display, is emerging, being furnished with a memory function, as well as various functions of a CPU, interface, I/O and input by pen by using TFTs. In these cases, the role played by the TFT is not limited only to that of a simple switching element; i.e., performance and reliability are required by taking the logic circuits into account.

When the TFT is used as a logic element, eight kinds of voltage patterns will be applied to the three terminals of the gate, source and drain, as tabulated below, wherein "H" denotes a high level and "L" denotes a low level.

| | | Patterns | | | | | | | |
|---|---|---|---|---|---|---|---|---|---|
| | | 1 | 2 | 3 | 4 | 5 | 6 | 7 | 8 |
| electrode | Gate | H | L | H | L | H | L | L | H |
| | Source | H | H | L | L | L | H | L | H |
| | Drain | L | L | H | H | L | H | L | H |

So far, a TFT has been used for driving a liquid crystal pixel, and the above-mentioned patterns 1 to 4 have been exclusively used, i.e., relations of a potential difference across the source and the drain have been exclusively used. When a potential difference develops across the source and the drain, a high electric field is established in the TFT, and a carrier having abnormally high energy (hereinafter referred to as hot carrier) is generated. The hot carrier that is injected into the gate oxide film causes a problem of deterioration in the characteristics of a TFT.

It has heretofore been attempted to solve the problem of a hot carrier that is generated when a high electric field is applied across the source and the drain. As a means for solving this problem, there have been proposed a lightly doped drain (LDD) structure and a double drain structure, as disclosed in "Submicron Device 2", by Mitsumasa Koyanagi, Maruzen Co., 1995, p. 187. According to these structures, a high electric field applied across the source and the drain is relaxed to prevent the generation of a hot carrier. These structures involve the case when a single crystal is used as a semiconductor. The same, however, also holds true even in the case of a TFT.

SUMMARY OF THE INVENTION

However, almost no consideration has been given to the problem of deterioration caused by a voltage application pattern 6 that is tabulated above. This is because, in the conventional TFT for simply driving a liquid crystal pixel, such a voltage application pattern has seldom occurred. When a peripheral circuit is fabricated by using the TFTs, however, the voltage application pattern 6 tabulated above occurs in an analog switch used, for example, for a shift register.

In an n-channel TFT in which the source assumes the level "H" and the drain is assuming "H", in particular, the on-current drastically decreases and the TFT characteristics are deteriorated when a stress is applied to the gate, i.e., when "L" and "H" are alternatingly input to the gate (hereinafter, this stress mode is referred to as the gate-negative pulse mode). The cause of deterioration of the TFT characteristics in the gate-negative pulse mode is as described below. When the gate voltage changes from "H" into "L", the channel region changes from a depletion layer in which no carrier is present into an accumulated layer in which holes are present in an excess amount. In this case, holes are induced on the surface of the semiconductor thin film from the channel region of the semiconductor thin film. Here, it is considered that the holes gain high energy due to an electric field of a gate-negative pulse and turn into hot holes which are then injected into the gate oxide film, whereby an interface level is generated on the surface of the semiconductor device to greatly deteriorate the TFT characteristics.

The object of the present invention is to provide a TFT having a structure in which the characteristics are not deteriorated in the gate-negative pulse mode.

Moreover, an object of the present invention is to provide a liquid crystal display device which features a simplified circuitry and an improved display quality by employing a TFT which is less deteriorated in the gate-negative pulse mode, for a liquid crystal display device, the circuitry of which is becoming complex or the display quality of which is becoming poor, due to a limitation on the range, when utilizing the TFT which is deteriorated in the gate-negative pulse mode.

Furthermore, it is an object of the present invention to provide a liquid crystal display device equipped with a shift register having improved reliability by employing in the shift register a TFT which is less deteriorated in the gate-negative pulse mode.

Moreover, it is an object of the present invention to provide a liquid crystal display device using an analog switch having improved reliability by utilizing in the analog switch a TFT which is less deteriorated in the gate-negative pulse mode.

According to the present invention, the above-mentioned objects are accomplished by providing the semiconductor thin film of a TFT with a p-type semiconductor region that is in contact with a channel region, but is electrically connected to nowhere except the channel region. Upon employing this structure, holes induced on the surface by the gate-negative pulses are further supplied from the p-type semiconductor region. The holes supplied from the p-type semiconductor region relax the electric field established by the gate-negative pulse. Therefore, less hot holes are injected into the gate oxide film, and the TFT characteristics are less deteriorated. Besides, the p-type semiconductor region needs to be connected to nowhere except the channel region and can, hence, be replaced by a conventional TFT, and an increase in the TFT area is confined to the p-type semiconductor region only.

According to the present invention, furthermore, the above-mentioned objects are accomplished by using the above-mentioned TFTs as n-channel insulated gate thin-film transistors in the liquid crystal display device, by using the above-mentioned TFTs as n-channel insulated gate thin-film transistors to constitute shift registers in the peripheral circuit, and by using the above-mentioned TFTs as n-channel insulated gate thin-film transistors to constitute analog switches in the peripheral circuit.

That is, the present invention is concerned with an n-channel insulated gate thin-film transistor using electrons as a main current carrier and comprising a semiconductor thin film formed on an insulating substrate and a gate electrode formed on said semiconductor thin film via a gate insulating film, said semiconductor thin film having a source region and a drain region which are n-type semiconductor regions formed therein sandwiching a channel region which is an intrinsic semiconductor region just under the gate electrode, wherein said semiconductor thin film has a p-type semiconductor region in contact with the channel region, and said p-type semiconductor region is electrically connected to nowhere except the channel region.

The present invention is further concerned with an n-channel insulated gate thin-film transistor using electrons as a main current carrier and comprising a gate electrode formed on an insulating substrate and a semiconductor thin film formed on said gate electrode via a gate insulating film, said semiconductor thin film having a source region and a drain region which are n-type semiconductor regions formed therein sandwiching a channel region which is an intrinsic semiconductor region just over the gate electrode, wherein said semiconductor thin film has a p-type semiconductor region in contact with said channel region, and said p-type semiconductor region is electrically connected to nowhere except the channel region.

Moreover, the present invention is concerned with an n-channel insulated gate thin-film transistor using electrons as a main current carrier and comprising an insulating film formed on a semiconductor substrate, a semiconductor thin film formed on said insulating layer and a gate electrode formed on said semiconductor thin film via a gate insulating film, said semiconductor thin film having a source region and a drain region which are n-type semiconductor regions formed therein sandwiching a channel region which is an intrinsic semiconductor region just under the gate electrode, wherein said semiconductor thin film has a p-type semiconductor region in contact with the channel region, and said p-type semiconductor region is electrically connected to nowhere except the channel region.

The present invention is further concerned with a liquid crystal display device comprising:

an active matrix including a plurality of scanning electrodes formed on an insulating substrate, a plurality of video signal electrodes formed so as to intersect the scanning electrodes, thin-film transistors connected to the scanning electrodes and to the video signal electrodes, and pixel electrodes connected to said thin-film transistors;

a peripheral circuit formed on said insulating substrate by the same method as that of forming said thin-film transistors;

an opposing substrate opposed to said insulating substrate; and liquid crystals held between said insulating substrate and said opposing substrate;

wherein said n-channel insulated gate thin-film transistors are used as said thin-film transistors.

In the liquid crystal display device, the TFT characteristics are little deteriorated when the above-mentioned n-channel insulated gate thin-film transistors are used for the shift registers in the peripheral circuit and, particularly, when the above-mentioned n-channel insulated gate thin-film transistors are used to play the role of analog switches in the shift registers in the peripheral circuit.

DETAILED DESCRIPTION OF THE PREFERRED EMBODIMENTS

Embodiments of the present invention will now be described with reference to the drawings.

[Embodiment 1]

Figure 1:
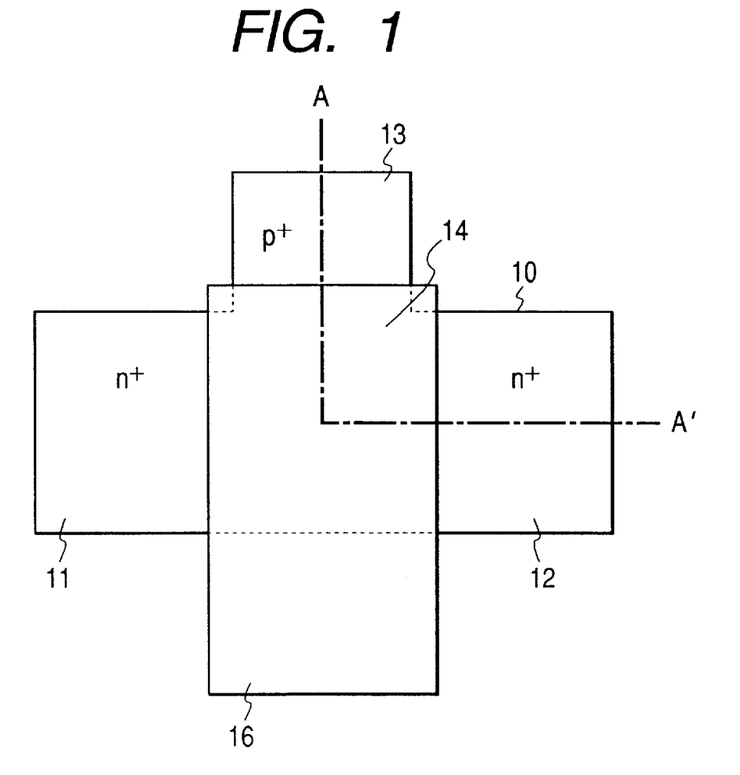
FIG. 1 is a schematic plan view of a TFT according to the present invention.
Figure 2:
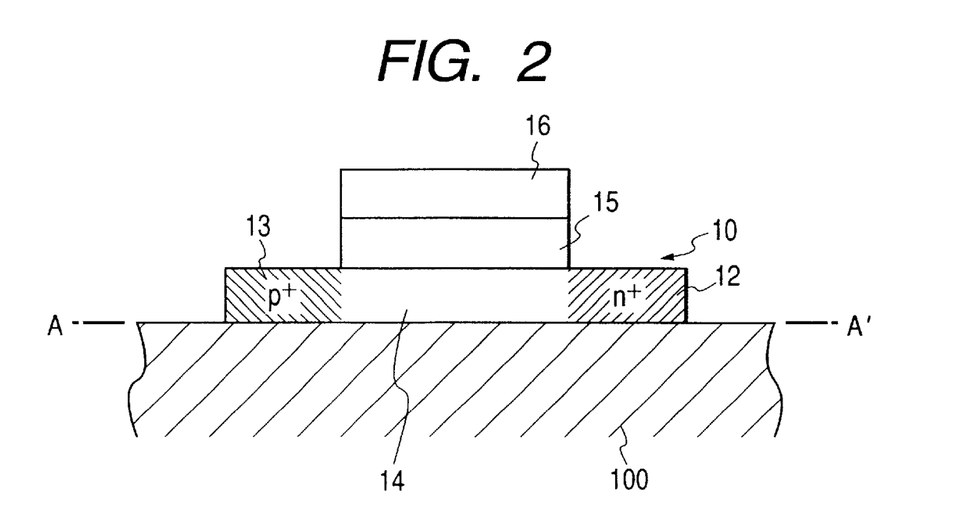
FIG. 2 is a schematic sectional view taken along a line A–A' in FIG. 1.
Figure 3A:
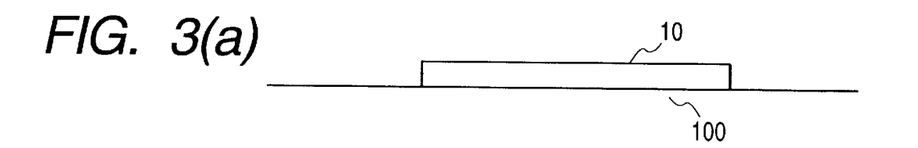
FIGS. 3(a) to 3(e) are diagrams illustrating the steps for producing the TFT according to the present invention.
Figure 3B:
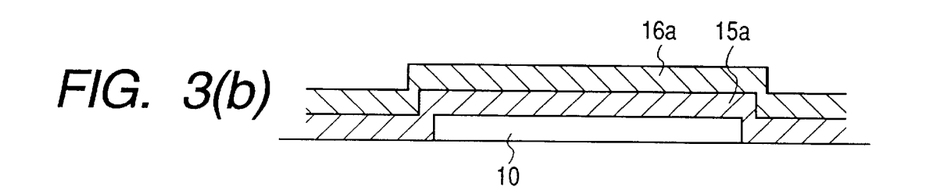
Figure 3C:
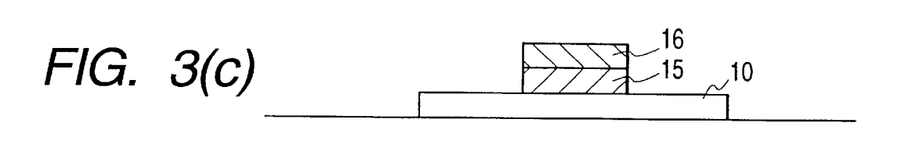
Figure 3D:
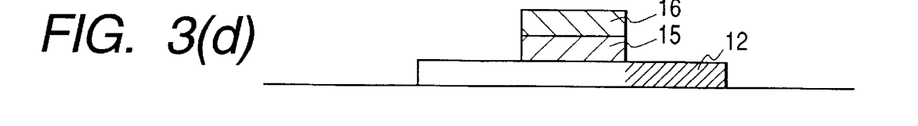
Figure 3E:
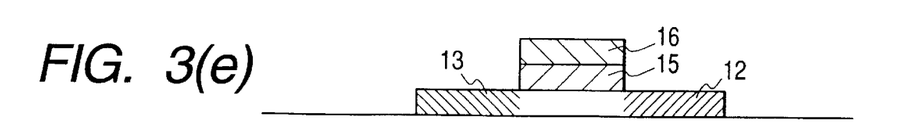

FIG. 1 is a schematic plan view illustrating a TFT according to the present invention, and FIG. 2 is a schematic sectional view taken along a line A–A' in FIG. 1. A substrate 100 is made of glass. A first layer is a thin polysilicon film 10. The thin polysilicon film 10 is constituted by a source 11 and a drain 12, which are n-type semiconductor regions, a p-type semiconductor region 13, and a channel region 14 just under a gate 16, which is an intrinsic semiconductor region. A second layer is a gate insulating film 15 which insulates the gate 16 and the thin polysilicon film 10 from each other. A third layer is the gate 16 having the same shape as the gate insulating film 15. Upon applying a positive voltage to the gate 16, an inverted layer in which the electrons are present in an excess amount is formed in the channel region 14 to form a channel, whereby the source 11 and the drain 12 are rendered conductive to each other to obtain a switching operation.

In the TFT structure of this embodiment, the holes induced on the surface due to a gate-negative pulse are further supplied from the p-type semiconductor region 13. The holes supplied from the p-type semiconductor region 13 relax the electric field established by the gate-negative pulse. Therefore, fewer hot holes are injected into the gate insulating film 15, and the TFT characteristics are less deteriorated.

FIGS. 3(a) to 3(e) illustrate the steps for producing the above-mentioned TFT. The sectional views of FIG. 3 correspond to a cross section taken along the line A–A' in FIG. 1. A thin amorphous silicon film is deposited to a thickness of 60 nm on the glass substrate 100. Upon irradiating the thin film with a laser beam, amorphous silicon is polycrystallized to form a so-called low-temperature polysilicon. Depending upon photolithographic technology, furthermore, polysilicon is etched to form a thin polysilicon film 10 in the form of an island (FIG. 3(a)). Next, a silicon oxide laser 15a is grown in vapor phase to form a gate insulating film. Then, a metal 16a, such as aluminum, is deposited to form a gate (FIG. 3(b)). Next, the gate and the gate insulating film are etched relying upon the photolithographic technology to form a gate 16 and a gate insulating film 15 (FIG. 3(c)). Then, impurities of the Group 5 the periodic table, such as phosphorus ions, are implanted into an thin polysilicon film by, for example, the ion-doping method to form n-type semiconductor regions that form a source 11 and a drain 12 (FIG. 3(d)). Then, impurities of the Group 3 the periodic table, such as boron ions, are implanted into the thin polysilicon film by, for example, the ion-doping method to form a p-type semiconductor region (FIG. 3(e)). Thus, the TFT of the present invention is produced.

Figure 4:
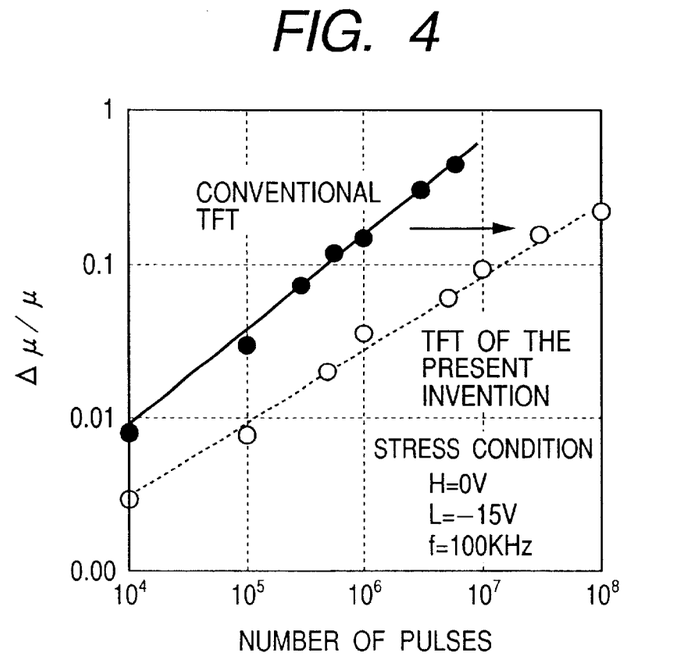
FIG. 4 is a graph comparing the degrees of degradation when stress is applied to the TFT of the present invention and to the TFT of a conventional structure.

FIG. 4 illustrates the degrees of degradation of when a pulse stress of "L" and "H" is applied to the gate of the TFT of the present invention having the p-type semiconductor region 13 and to the gate of a conventional TFT without a p-type semiconductor region, with their source potential being maintained at "H" and drain potential being maintained at "H", and with "L" and "H" pulse stress applied to the gate. The "L" level is set to be −15 V, the "H" level is set to be 0 V, and the pulse width is set to be 10 $\mu$s. In FIG. 4, the ordinate represents the amount obtained by dividing an amount of change $\Delta\mu$ in the mobility of TFT by an initial mobility $\mu$. When the life of the element is defined to be an amount of deterioration in the mobility $\Delta\mu/\mu$=0.2, it will then be obvious from FIG. 4 that the TFT of the present invention exhibits a life extended into 50 times as long as that of the conventional TFT.

In this embodiment, the thin semiconductor film is formed of polysilicon. It, however, may be formed of amorphous silicon, single crystalline silicon, single crystalline germanium or the like.

[Embodiment 2]

Figure 5:
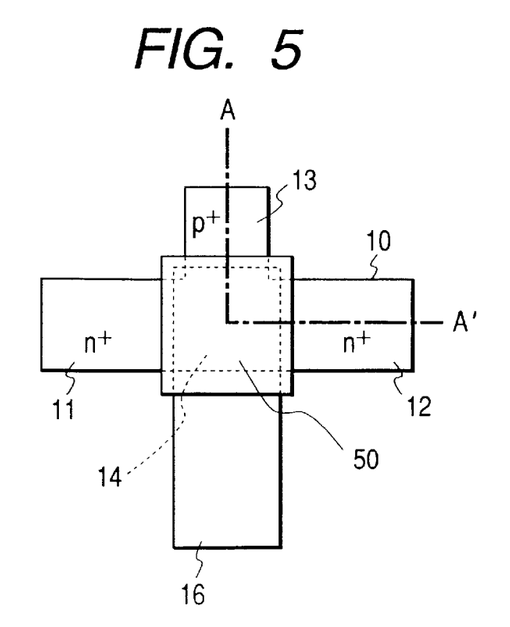
FIG. 5 is a schematic plan view illustrating a bottom gate type TFT according to the present invention.
Figure 6:
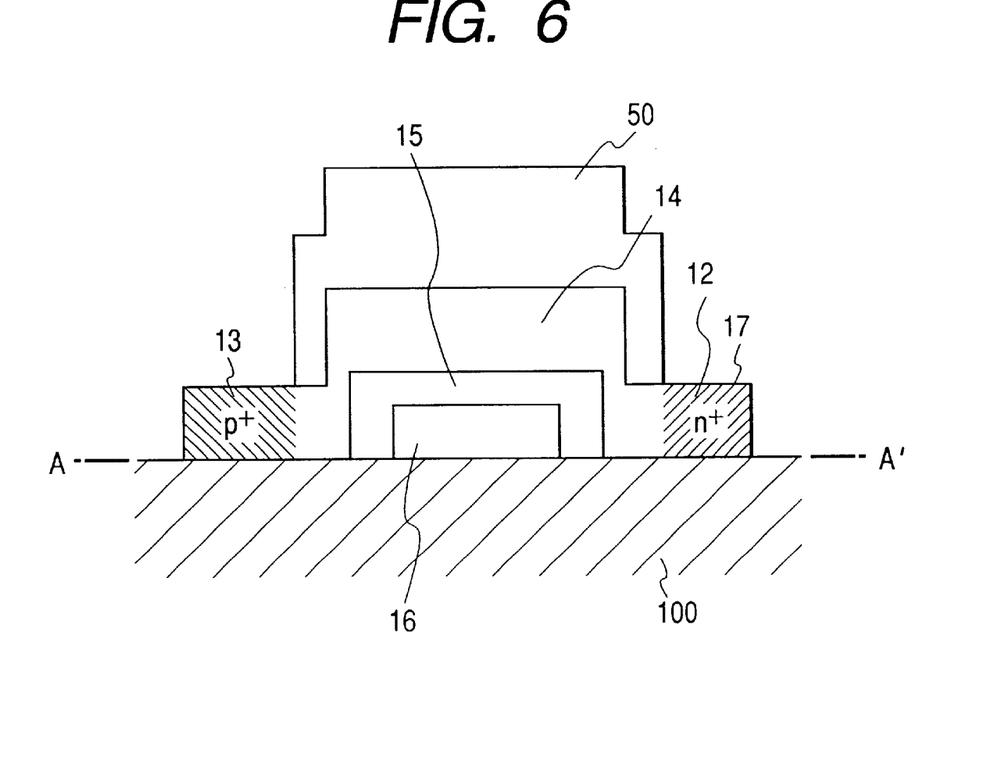
FIG. 6 is a schematic sectional view taken along a line A–A' in FIG. 5.

FIG. 5 is a schematic plan view of a bottom gate type TFT according to the present invention, and FIG. 6 is a schematic sectional view taken along a line A–A' in FIG. 5. A substrate 100 is make of glass. A first layer is a gate 16. A second layer is a gate insulating film 15 which insulates the gate 16 and a thin polysilicon film 10 from each other. A third layer is the thin polysilicon film 10. In the thin polysilicon film 10 are formed a source 11 and a drain 12 which are n-type semiconductor regions, a p-type semiconductor region 13, and a channel region 14 which is an intrinsic semiconductor region just over the gate electrode. A fourth layer is a channel protection film 50 for protecting the channel. Upon applying a positive voltage to the gate 16, an inverted layer in which the electrons are present in an excess amount is formed in the channel region 14, thereby to form a channel, whereby the source 11 and the drain 12 are rendered conductive relative to each other to obtain a switching operation. In the TFT of this embodiment, when a negative pulse is applied to the gate, holes are supplied into the channel region 14 from the p-type semiconductor region 13, and the TFT characteristics are prevented from being deteriorated.

[Embodiment 3]

Figure 7:
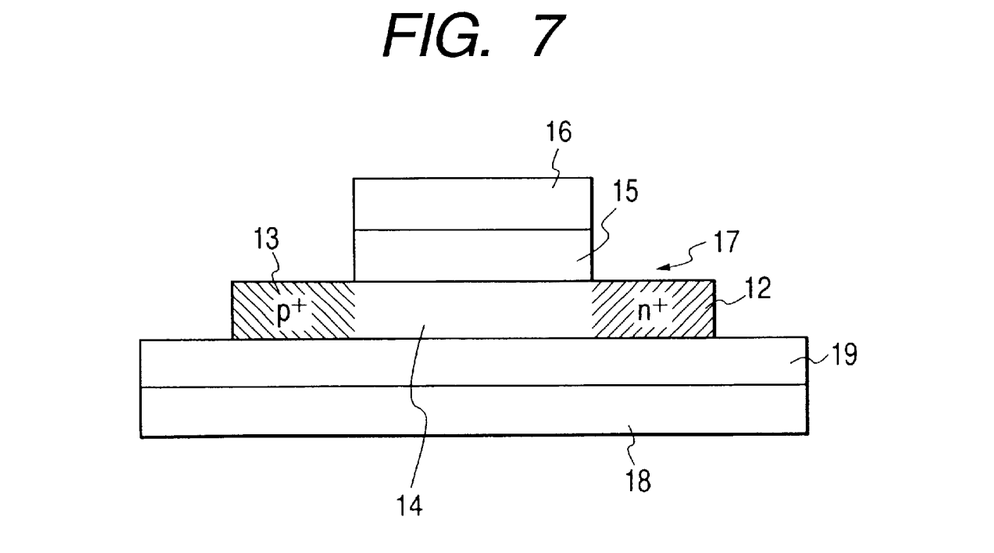
FIG. 7 is a schematic sectional view of an n-channel SOI-MOSFET according to the present invention.

FIG. 7 is a schematic sectional view of an SOI-MOSFET according to the present invention. FIG. 7 corresponds to FIG. 2 and FIG. 6, and in which a drain 12 and a p-type semiconductor region 13 are present in a semiconductor film 17. An insulating layer 19 is formed on a semiconductor substrate 18, and the semiconductor film 17, which is the first layer, is formed on the insulating layer 19. The semiconductor film 17 is formed by, for example, single crystalline silicon or a single crystal of gallium-arsenic. The semiconductor film 17 is constituted by a source and a drain 12 which are n-type semiconductor regions, a p-type semiconductor region 13, and a channel region 14, which is an intrinsic semiconductor region just under the gate. A second layer is a gate insulating film 15 which insulates the gate 16 and the semiconductor film 10 from each other. A third layer is the gate 16 having the same shape as the gate insulating film 15. Upon applying a positive voltage to the gate 16, an inverted layer in which the electrons are present in an excess amount is formed in the channel region 14 thereby to form a channel, whereby the source and the drain 12 are rendered conductive relative to each other to obtain a switching operation. In the SOI-MOSFET structure of this embodiment, holes induced on the surface due to a gate-negative pulse are further supplied from the p-type semiconductor region 13. The holes supplied from the p-type semiconductor region 13 relax the electric field established by the gate-negative pulse. Therefore, fewer hot holes are injected into the gate-insulating film 15, and the SOI-MOSFET characteristics are less deteriorated.

[Embodiment 4]

Described below is an embodiment in which an active matrix circuit and a peripheral circuit in the liquid crystal display device are fabricated by using n-channel FETs of the present invention.

Figure 8:
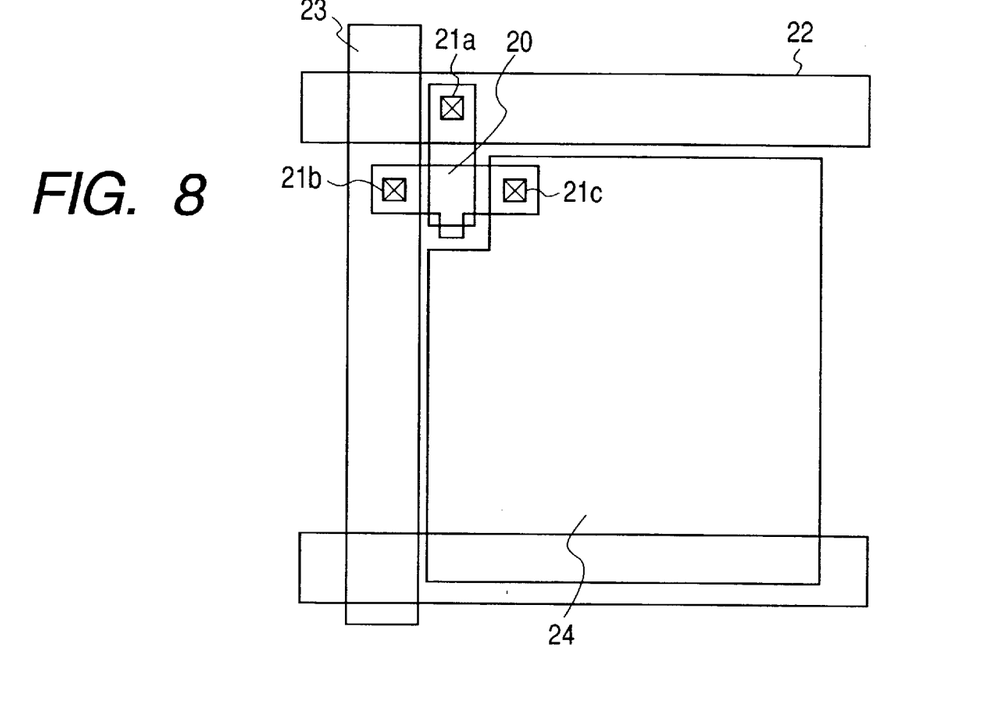
FIG. 8 is a plan view of a unit pixel in a liquid crystal display device using the TFT of the present invention.

FIG. 8 is a plan view illustrating a unit pixel in the liquid crystal display device constituted by using the n-channel TFT of the present invention. A scanning electrode 22 and the gate of a TFT 20 of the present invention are connected together through a hole 21a, a signal electrode 23 and the drain of the TFT 20 of the present invention are connected together through a hole 21b, and a pixel electrode 24 and the source of the TFT 20 of the present invention are connected together through a hole 21c. The TFT 20 is turned on when a selection signal is input to the scanning electrode 22 and a voltage is applied to the gate of the TFT 20. A video signal voltage is input to the signal electrode 23 while the TFT 20 is turned on, and is transmitted from the drain of the TFT 20 to the source thereof and is applied to the pixel electrode 24 to drive the liquid crystal. By using the TFT 20 of the present invention as a pixel drive element, a drive waveform of a gate-negative pulse can be input to the pixel.

Figure 9:
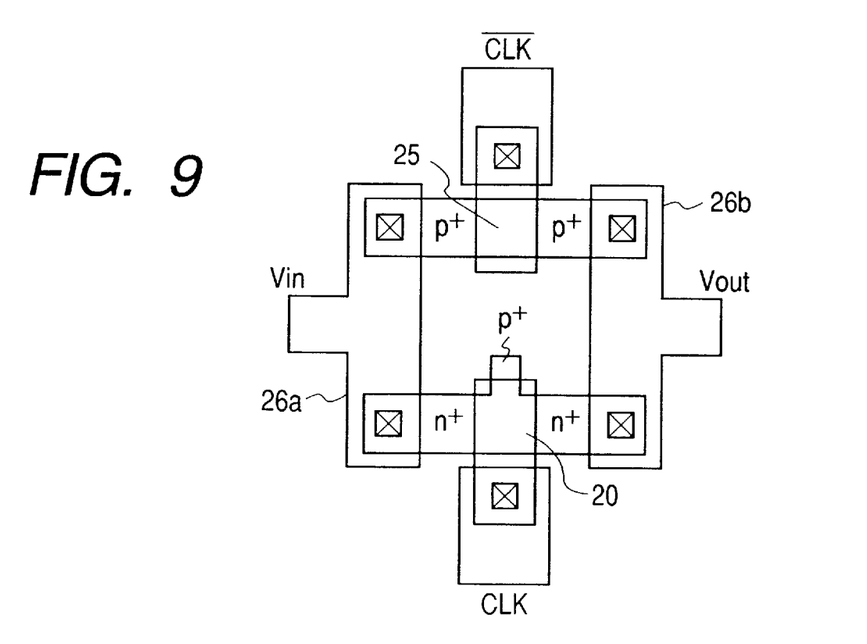
FIG. 9 is a plan view of an analog switch using the TFT of the present invention.

FIG. 9 is a plan view of an analog switch constituted by using the n-channel TFT of the present invention. This is a constitution in which the drain of the n-channel TFT 20 of the present invention and the drain of the p-channel TFT 25 are connected together through a wiring electrode 26a to form Vin, the source of the n-channel TFT 20 of the present invention and the source of the p-channel TFT 25 are connected together through a wiring electrode 26b to form Vout, and clock signals having phases different by 180 degrees from each other are applied to the gate of the n-channel TFT 20 of the present invention and to the gate of the p-channel TFT 25. This constitutes a switching circuit in which a signal input to Vin is directly transmitted to Vout when the clock signal is "H" and a signal input to Vin is interrupted when the clock signal is "L". In this circuit, a gate-negative pulse mode is applied to the n-channel TFT 20 of the present invention when Vin and Vout are "H". Even in such a case, the n-channel TFT 20 of the present invention is not deteriorated, unlike the conventional n-channel TFT, and a stable analog switch can be constituted.

Figure 10:
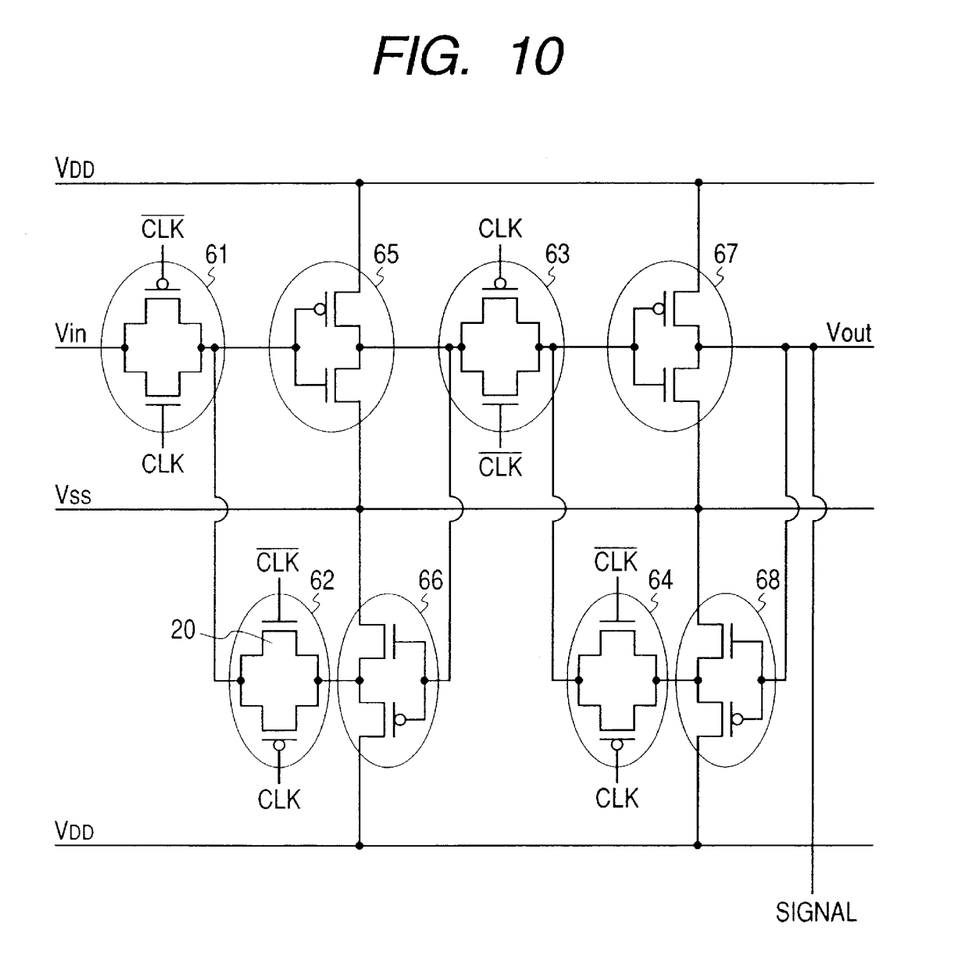
FIG. 10 is a schematic circuit diagram of a static shift register circuit using the TFTs of the present invention.

FIG. 10 is a diagram illustrating one stage of a static shift register circuit constituted by using the n-channel TFTs of the present invention. One stage of the static shift register is constituted by four analog switches 61, 62, 63, 64, four inverters 65, 66, 67, 68, and power source lines $V_{DD}$ and $V_{SS}$ for supplying electric power to the inverters. One stage of the shift register works to delay a pulse wave input to Vin by one clock period and to send it to Vout and to the signal. The analog switches shown in FIG. 9 are used as the analog switches 61 to 64. In particular, a gate-negative pulse mode is frequently applied to the n-channel TFT 20 that constitutes the analog switch 62 in FIG. 10. Even in such a case, however, the n-channel TFT 20 of the present invention is not deteriorated, unlike the conventional TFT, and a stable static shift register is realized.

Figure 11:
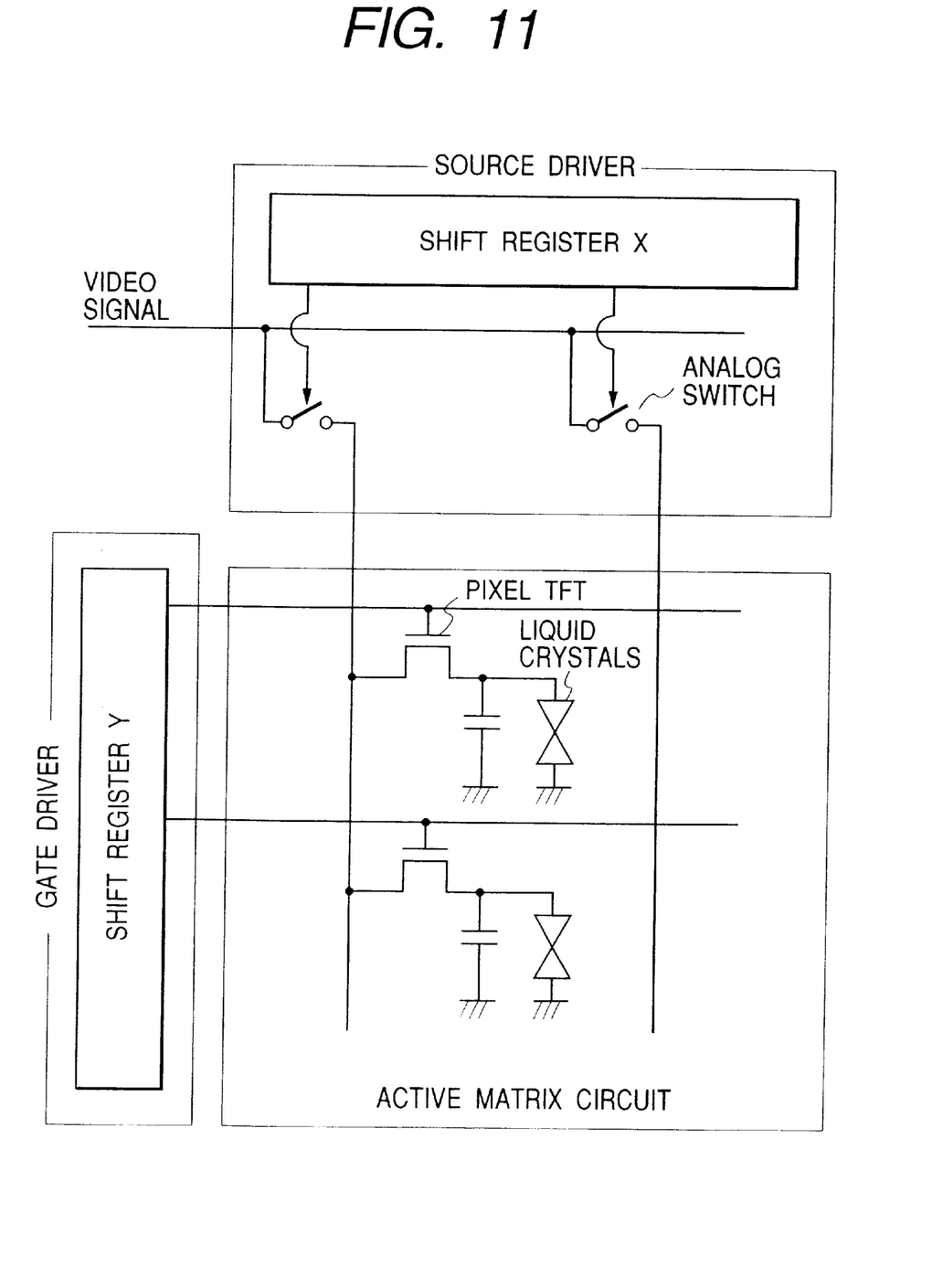
FIG. 11 is a block diagram of a peripheral circuit and an active matrix circuit in the liquid crystal display device constituted by using the TFTs of the present invention.

FIG. 11 is a block diagram illustrating a peripheral circuit and an active matrix circuit in the liquid crystal display device constituted by using the n-channel TFTs of the present invention. A gate driver works to successively select the scanning electrodes connected to the gates of the unit pixel TFTs constituting the active matrix. The gate driver is constituted chiefly by the shift register. On the other hand, the source driver works to supply a signal voltage to the pixel electrodes that constitute the active matrix circuit and is chiefly constituted by the shift register and the analog switch. By constituting the source driver and the gate driver by using at least the n-channel TFTs of the present invention, it is possible to constitute a peripheral circuit and an active matrix circuit which are highly reliable.

Figure 12:
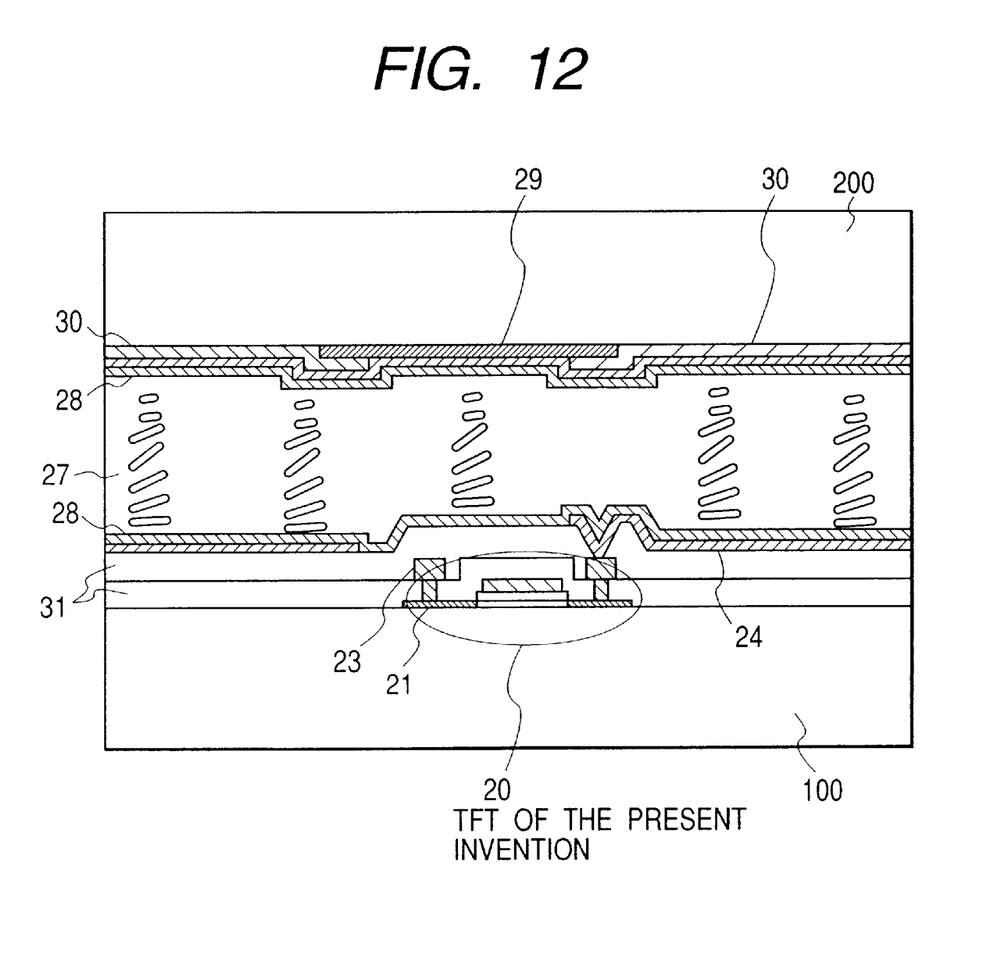
FIG. 12 is a schematic sectional view of a liquid crystal display device constituted by using the TFTs of the present invention.

FIG. 12 is a schematic sectional view of the liquid crystal display device of the present invention. Liquid crystals 27 are sandwiched between the lower glass substrate 100 including the active matrix circuit and an upper opposing glass substrate 200. Though not illustrated, scanning electrodes and signal electrodes 23 are formed like a matrix on the glass substrate 100 that includes the active matrix circuit, and a pixel electrode 24 is driven via an n-channel TFT 20 of the present invention formed near an intersecting point thereof. Here, an interlayer insulating film 31 maintains the electric insulation between the pixel electrode and the TFT of the present invention and among the electrodes. On the opposing glass substrate 200 are formed a color filter 30 and a light-shielding film 29 that forms a black matrix pattern for shielding the light. The liquid crystals are in contact with an orientation film 28 so as to possess tilted angles.

Figure 13:
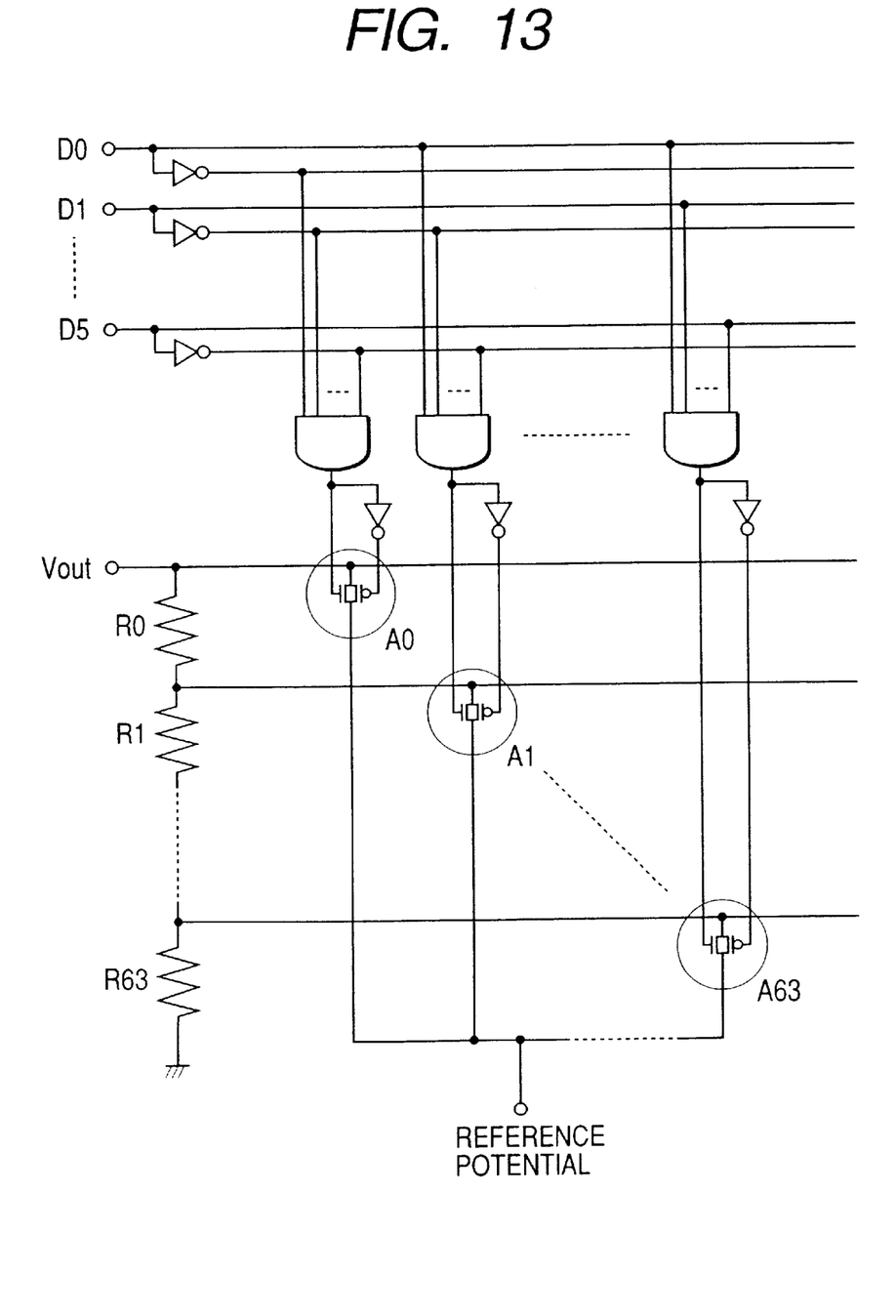
FIG. 13 is a schematic circuit diagram of a DA converter constituted by using the TFTs of the present invention.

FIG. 13 is a circuit diagram of a basic 6-bit DA converter for converting a digital signal into an analog signal when a video signal is, for example, a digital signal. Six-bit digital signals D0 to D5 that are input are analyzed by a decoder, and the voltages are applied by the analog switches A0 to A63 to the resistors R0 to R63 so as to be converted into analog voltage signals and are output to Vout. By using the TFTs of the present invention as the n-channel TFTs to constitute the analog switches A0 to A63, it is possible to highly enhance the reliability of the analog switches.

Figure 14:
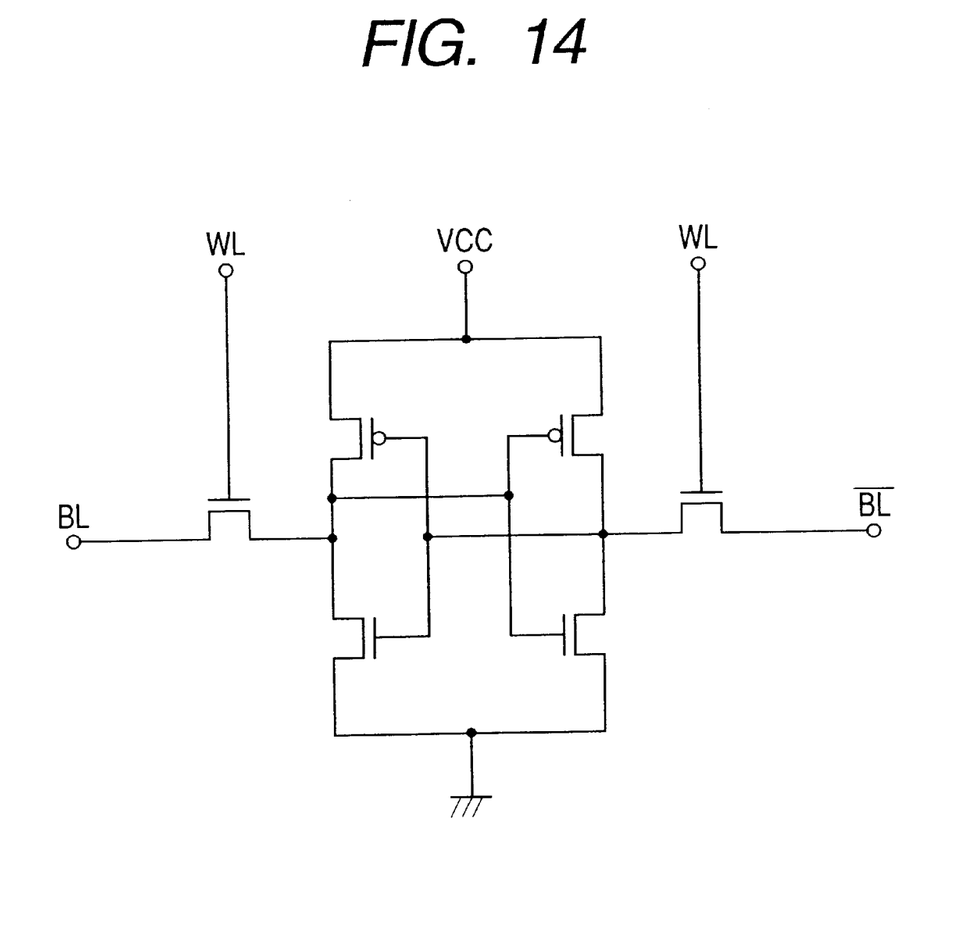
FIG. 14 is a schematic circuit diagram of a static random access memory cell constituted by using the TFTs of the present invention.

FIG. 14 is a diagram illustrating a unit cell in a static random access memory (SRAM) when the liquid crystal display device is equipped with, for example, a memory that is simply constituted by using n-channel TFTs and p-channel TFTs. The circuit itself is constituted in a customary manner. When a word line (WL) is selected to assume the "H" level, the data of a bit line (BL) is stored in the SRAM. Here, by using the TFTs of the present invention as n-channel TFTs, it is possible to realize an SRAM having high reliability.

According to the present invention, the n-channel TFT has a p-type semiconductor region which is in contact with the channel region. Therefore, the TFT is less deteriorated in the gate-negative pulse mode, and the reliability is improved. According to the TFT of the present invention having a p-type semiconductor region in contact with the channel region, furthermore, the TFT is less deteriorated in the gate-negative pulse mode, making it possible to obtain a liquid crystal display device featuring improved reliability.

What is claimed is:

1. An n-channel insulated gate thin-film transistor using electrons as a main current carrier and comprising a semiconductor thin film formed on an insulating substrate and a gate electrode formed on said semiconductor thin film via a gate insulating film, said semiconductor thin film having a source region and a drain region which are n-type semiconductor regions formed therein sandwiching a channel region which is an intrinsic semiconductor region just under the gate electrode, wherein said semiconductor thin film has a p-type semiconductor region in contact with the channel region, and said p-type semiconductor region is electrically connected to nowhere except said channel region.

2. An n-channel insulated gate semiconductor thin-film transistor according to claim 1, wherein said semiconductor thin film is formed of polysilicon.

3. An n-channel insulated gate thin-film transistor using electrons as a main current carrier and comprising a gate electrode formed on an insulating substrate and a semiconductor thin film formed on said gate electrode via a gate insulating film, said semiconductor thin film having a source region and a drain region which are n-type semiconductor regions formed therein sandwiching a channel region which is an intrinsic semiconductor region just over the gate electrode, wherein said semiconductor thin film has a p-type semiconductor region in contact with said channel region, and said p-type semiconductor region is electrically connected to nowhere except said channel region.

4. An n-channel insulated gate thin-film transistor using electrons as a main current carrier and comprising an insulating film formed on a semiconductor substrate, a semiconductor thin film formed on said insulating layer and a gate electrode formed on said semiconductor thin film via a gate insulating film, said semiconductor thin film having a source region and a drain region which are n-type semiconductor regions formed therein sandwiching a channel region which is an intrinsic semiconductor region just under the gate electrode, wherein said semiconductor thin film has a p-type semiconductor region in contact with the channel region, and said p-type semiconductor region is electrically connected to nowhere except said channel region.

5. A liquid crystal display device comprising:

an active matrix including a plurality of scanning electrodes formed on an insulating substrate, a plurality of video signal electrodes formed so as to intersect the scanning electrodes, thin-film transistors connected to the scanning electrodes and to the video signal electrodes, and pixel electrodes connected to said thin-film transistors;

a peripheral circuit formed on said insulating substrate;

an opposing substrate opposed to said insulating substrate; and liquid crystals held between said insulating substrate and said opposing substrate;

wherein said n-channel insulated gate thin-film transistors according to claim 1 are used as said thin-film transistors.

6. A liquid crystal display device comprising:

an active matrix including a plurality of scanning electrodes formed on an insulating substrate, a plurality of video signal electrodes formed so as to intersect the scanning electrodes, thin-film transistors connected to the scanning electrodes and to the video signal electrodes, and pixel electrodes connected to said thin-film transistors;

a peripheral circuit formed on said insulating substrate;

an opposing substrate opposed to said insulating substrate; and liquid crystals held between said insulating substrate and said opposing substrate;

wherein said n-channel insulated gate thin-film transistors according to claim 2 are used as said thin-film transistors.

7. A liquid crystal display device comprising:

an active matrix including a plurality of scanning electrodes formed on an insulating substrate, a plurality of video signal electrodes formed so as to intersect the scanning electrodes, thin-film transistors connected to the scanning electrodes and to the video signal electrodes, and pixel electrodes connected to said thin-film transistors;

a peripheral circuit formed on said insulating substrate;

an opposing substrate opposed to said insulating substrate; and liquid crystals held between said insulating substrate and said opposing substrate;

wherein said n-channel insulated gate thin-film transistors according to claim 3 are used as said thin-film transistors.

* * * * *